(12) United States Patent
Jiang et al.

(10) Patent No.: US 11,393,364 B2
(45) Date of Patent: Jul. 19, 2022

(54) SEAMLESS SPLICING SCREEN (71) Applicant: Shenzhen China Star Optoelectronics Semiconductor Display Technology Co., Ltd., Shenzhen (CN)

(72) Inventors: Bei Jiang, Shenzhen (CN); Yong Fan, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 363 days.

(21) Appl. No.: 16/620,539

(22) PCT Filed: Nov. 4, 2019

(86) PCT No.: PCT/CN2019/115444
§ 371 (c)(1),
(2) Date: Dec. 9, 2019

(87) PCT Pub. No.: WO2021/012458
PCT Pub. Date: Jan. 28, 2021

(65) Prior Publication Data
US 2021/0358347 A1 Nov. 18, 2021

(30) Foreign Application Priority Data

Jul. 23, 2019 (CN) .......................... 201910666129.9

(51) Int. Cl.
*G09F 9/33* (2006.01)
*G09F 9/302* (2006.01)
(Continued)

(52) U.S. Cl.
CPC .............. *G09F 9/33* (2013.01); *G09F 9/3026* (2013.01); *G09G 3/32* (2013.01); *H01L 27/156* (2013.01);
(Continued)

(58) Field of Classification Search
CPC ......... G06F 3/1446; G06F 2203/04102; G06F 1/1632; G06F 2200/1612;
(Continued)

(56) References Cited

U.S. PATENT DOCUMENTS 9,614,022 B2 * 4/2017 Miyake ............... H01L 51/5212
2006/0044215 A1 * 3/2006 Brody .................. G09G 3/3208
345/1.3

(Continued)

FOREIGN PATENT DOCUMENTS

CN 102568321 7/2012
CN 102819987 12/2012
(Continued)

*Primary Examiner* — Dong Hui Liang (57) ABSTRACT

A seamless splicing screen is provided. The seamless splicing screen includes a plurality of unit display modules spliced with each other. Each of the unit display modules includes a unit display area and a unit non-display area. In a first direction of the seamless splicing screen, unit display areas of any adjacent first unit display module and second unit display module are adjacent to each other. A back of the unit display area of the first unit display module has a hollowed out portion disposed away from an end of the unit non-display area, and the unit non-display area of the second unit display module is disposed in the hollowed out portion.

16 Claims, 3 Drawing Sheets

(51) Int. Cl.
  *H01L 27/15* (2006.01)
  *H01L 33/62* (2010.01)
  *G09G 3/32* (2016.01)
  *H05K 1/18* (2006.01)
  *H01L 33/56* (2010.01)

(52) U.S. Cl.
  CPC .............. *H01L 33/56* (2013.01); *H01L 33/62* (2013.01); *H05K 1/189* (2013.01); *H05K 2201/10128* (2013.01)

(58) Field of Classification Search
  CPC ......... G09G 2300/026; G09G 2360/04; G09G 5/12; G09G 3/3426
  See application file for complete search history.

(56) References Cited

U.S. PATENT DOCUMENTS

| | | | | |
|---|---|---|---|---|
| 2007/0001927 | A1* | 1/2007 | Ricks | G09F 9/3026 345/1.1 |
| 2016/0014882 | A1* | 1/2016 | Jongman | H05K 1/028 156/247 |
| 2016/0086533 | A1 | 3/2016 | Song et al. | |
| 2016/0210103 | A1* | 7/2016 | Yoshizumi | H01L 27/14681 |
| 2017/0031643 | A1* | 2/2017 | Jeong | G06F 3/1446 |
| 2017/0192273 | A1 | 7/2017 | Fan | |
| 2017/0192733 | A1* | 7/2017 | Huang | G06F 3/1431 |
| 2017/0249119 | A1* | 8/2017 | Ding | G09F 9/33 |
| 2018/0090639 | A1* | 3/2018 | Ting | H01L 33/382 |

FOREIGN PATENT DOCUMENTS

| | | |
|---|---|---|
| CN | 103646611 | 3/2014 |
| CN | 203659361 | 6/2014 |
| CN | 203760020 | 8/2014 |
| CN | 104269428 | 1/2015 |
| CN | 204144263 | 2/2015 |
| CN | 105044959 | 11/2015 |
| CN | 106128311 | 11/2016 |
| CN | 106783920 | 5/2017 |
| CN | 206480332 | 9/2017 |
| CN | 206610570 | 11/2017 |
| CN | 206711508 | 12/2017 |
| CN | 107806552 | 3/2018 |
| CN | 108205976 | 6/2018 |
| CN | 208384927 | 1/2019 |
| CN | 208655182 | 3/2019 |
| CN | 209103717 | 7/2019 |
| CN | 110379314 | 10/2019 |
| KR | 2018-0051116 | 5/2018 |
| TW | 200823515 | 6/2008 |

* cited by examiner

SEAMLESS SPLICING SCREEN

RELATED APPLICATIONS

This application is a National Phase of PCT Patent Application No. PCT/CN2019/115444 having International filing date of Nov. 4, 2019, which claims the benefit of priority of Chinese Patent Application No. 201910666129.9 filed on Jul. 23, 2019. The contents of the above applications are all incorporated by reference as if fully set forth herein in their entirety.

FIELD AND BACKGROUND OF THE INVENTION

The present disclosure relates to the field of display panel technologies, and more particularly to a seamless splicing screen.

The statements herein merely provide background information related to the present application and do not necessarily constitute prior art.

Mini-light emitting diodes (LEDs) refer to LED chips with a chip size of about 100 to 300 microns. Micro-LEDs refer to LED chips with a grain size below 100 microns. Mini-LEDs/Micro-LEDs can be used as self-illuminating LED displays with low power consumption, high brightness, high resolution, high color saturation, fast response speed, long life, and high efficiency. In particular, the Mini-LEDs/Micro-LEDs can be seamlessly spliced through unit display modules to achieve large screen display and have broad applications in large-scale display fields such as command and control centers, commercial centers, high-end conferences, and private theaters.

At present, commonly used large-screen splicing displays are liquid crystal display (LCD) splicing displays. The LCD splicing display is a splicing of LCD display units with an ultra-narrow bezel, and a splicing control software system is used to realize a large-screen splicing display performance. However, liquid crystal in the LCD display units is fluid, it is necessary to seal the liquid crystal in a specific area position with a sealant, and the sealant cannot be used for display, so that the sealant in the LCD display units can only be narrowed as much as possible and cannot be completely eliminated, resulting in an LCD splicing display with a narrow frame can still see a stitching gap of about 1 cm and cannot be seamlessly spliced. The Mini-LED/Micro-LED displays can be completely seamlessly spliced compared to narrow-frame LCD spliced displays. Therefore, the development of Mini-LED/Micro-LED seamless splicing technologies have great commercial value.

SUMMARY OF THE INVENTION

The present application provides a seamless splicing screen, a back of a unit non-display area of a unit display module has a hollowed out portion disposed away from an end of the unit non-display area, the unit non-display area of any unit display module is disposed in the hollowed out portion to cause unit display areas of any adjacent two unit display modules to be adjacent to each other, thereby realizing seamless splicing.

To solve the above issues, the technical solution provided by the present application is as follows.

The application provides a seamless splicing screen. The seamless splicing screen includes a plurality of unit display modules spliced with each other. Each of the unit display modules has a unit display area and a unit non-display area positioned on a side of the unit display area. In a first direction of the seamless splicing screen, any two adjacent unit display modules include a first unit display module and a second unit display module, a back of the unit display area of the first unit display module has a hollowed out portion disposed away from an end of the unit non-display area of the first unit display module, the unit non-display area of the second unit display module is disposed in the hollowed out portion to cause the unit display area of the first unit display module and the unit display area of the second unit display module to be adjacent to each other.

In an embodiment of the present disclosure, the hollowed out portion of the first unit display module matches the unit non-display area of the second unit display module.

In an embodiment of the present disclosure, each of the unit display modules includes a base substrate, the hollowed out portion is disposed on a base substrate of the first unit display module, and the unit non-display area of the base substrate of the second unit display module is disposed in the hollowed out portion.

In an embodiment of the present disclosure, in a second direction of the seamless splicing screen, any one of the unit display modules is arranged side by side with an adjacent unit display module, unit display areas of any two adjacent unit display modules are adjacent to each other, and the second direction is perpendicular to the first direction.

In an embodiment of the present disclosure, the seamless splicing screen further includes a display area and a non-display area positioned on at least one side of the display area, the display area includes the unit display areas of the unit display modules spliced with each other, the non-display area includes the unit non-display areas of the unit display modules in the second direction and positioned at an edge of the seamless splicing screen, the non-display area is positioned at an edge of the seamless splicing screen, and the second direction is perpendicular to the first direction.

In an embodiment of the present disclosure, the seamless splicing screen further includes a fixing mechanism positioned at a back of the unit display modules spliced with each other and fixedly connected to the unit display modules spliced with each other.

In an embodiment of the present disclosure, each of the unit display modules further includes a thin film transistor (TFT) array layer disposed on the base substrate and a light emitting layer disposed on the TFT array layer, and the light emitting layer is disposed in the unit display area.

In an embodiment of the present disclosure, the light emitting layer includes a plurality of LED chips distributed in an array, and the LED chips are electrically connected to the TFT array layer.

In an embodiment of the present disclosure, the LED chips include Mini-LEDs or Micro-LEDs.

In an embodiment of the present disclosure, the LED chips include a red LED chip, a green LED chip, and a blue LED chip.

In an embodiment of the present disclosure, the TFT array layer includes a flexible layer disposed on the base substrate and a driving circuit disposed on the flexible layer, the LED chips are electrically connected to the driving circuit, and the flexible layer of the first unit display module partially covers the unit non-display area of the second unit display module.

In an embodiment of the present disclosure, material of the flexible layer includes polyimide, and a thickness of the flexible layer ranges from 1 to 100 microns.

In an embodiment of the present disclosure, the driving circuit includes a pixel driving circuit disposed in the unit display area and a peripheral driving circuit disposed in the unit non-display area, the peripheral driving circuit is electrically connected to the pixel driving circuit, and the light emitting layer is disposed on the pixel driving circuit and electrically connected to the pixel driving circuit.

In an embodiment of the present disclosure, each of the unit display modules further includes a flexible circuit board and a printed circuit board, an end of the peripheral driving circuit away from the unit display area is electrically connected to an end of the flexible circuit board, another end of the flexible circuit board is electrically connected to the printed circuit board, the flexible circuit board is disposed at a side and a back of the unit non-display area of the unit display module, and the printed circuit board is disposed at the back of the unit display module.

In an embodiment of the present disclosure, each of the unit display modules further includes an encapsulation layer disposed in the unit display area, and the encapsulation layer is overlaid on the light emitting layer.

In an embodiment of the present disclosure, material of the encapsulation layer includes an epoxy, acrylic, or a silicone based resin material.

The application further provides a seamless splicing screen. The seamless splicing screen includes a plurality of unit display modules spliced with each other, each of the unit display modules has a unit display area and a unit non-display area positioned on a side of the unit display area, and the unit display area of each of the unit display modules includes a plurality of LED chips for emitting light and arranged in an array. In a first direction of the seamless splicing screen, any two adjacent unit display modules include a first unit display module and a second unit display module, a back of the unit display area of the first unit display module has a hollowed out portion disposed away from an end of the unit non-display area of the first unit display module, the unit non-display area of the second unit display module is disposed in the hollowed out portion to cause the unit display area of the first unit display module and the unit display area of the second unit display module to be adjacent to each other. In a second direction of the seamless splicing screen, any one of the unit display modules is arranged side by side with an adjacent unit display module, unit display areas of any two adjacent unit display modules are adjacent to each other, and the second direction is perpendicular to the first direction.

Beneficial effects of an embodiment of the present disclosure are that, unit non-display areas of unit display modules constituting the seamless splicing screen are disposed at a side of the unit display areas, so that the other three sides of the unit display areas have no border, and the position of the unit display areas without the border is advantageous for implementing seamless splicing technologies, and any two adjacent unit display modules are in a first direction of the seamless splicing screen, such as a first unit display module and a second unit display module. A back of the unit display area of the first unit display module has a hollowed out portion disposed away from an end of the unit non-display area of the first unit display module, the unit non-display area of the second unit display module is disposed in the hollowed out portion to cause the unit display area of the first unit display module and the unit display area of the second unit display module to be adjacent to each other to reach seamless splicing and the seamless splicing screen. Because the unit non-display area of the unit display module is only provided with the base substrate and the TFT array layer on the base substrate, and the thickness of the TFT array layer is very small, the two unit display modules in the first direction are spliced. The height of the splicing position is negligible and does not affect the display performance of the splicing position, so that the display performance of the seamless splicing screen is not affected. The light emitting layer of the unit display module is composed of a plurality of LED chips distributed in an array, and the LEDs in the LED chip are self-illuminating, so that the three sides of the unit display area of the unit display module can be frameless, when the adjacent unit display modules are spliced, the gap between the adjacent unit display area and the unit display area can be seamless, which is beneficial to realize seamless splicing technologies.

BRIEF DESCRIPTION OF THE SEVERAL VIEWS OF THE DRAWINGS

In order to more clearly illustrate the embodiments or the technical solutions in the prior art, the drawings used in the embodiments or the description of the prior art will be briefly described below. Obviously, the drawings in the following description are only for the application. For some embodiments, other drawings may be obtained from those of ordinary skill in the art without departing from the drawings.

DESCRIPTION OF SPECIFIC EMBODIMENTS OF THE INVENTION

The specific structural and functional details disclosed herein are merely representative and are for purposes of describing exemplary embodiments of the present application. The present application, however, may be embodied in many alternative forms and should not be construed as being limited to the embodiments set forth herein.

In the description of the present application, it is to be understood that the terms of the orientation or positional relationship of the indications "center", "lateral", "upper", "lower", "left", "right", "vertical", "horizontal", "top", "bottom", "inside", "outside", and the like are based on the orientation or positional relationship shown in the drawings, and are merely for convenience of description of the present application and simplified description, and do not indicate or imply that the indicated device or the components must have a particular orientation, constructed and operated in a particular orientation, and thus are not to be construed as limiting. Moreover, the terms "first" and "second" are used for descriptive purposes only and are not to be understood as indicating or implying a relative importance or implicitly indicating the number of technical features indicated. Thus, features defining "first" and "second" may include one or more of the features either explicitly or implicitly. In the description of the present application, "a plurality" means two or more unless otherwise stated. In addition, the term "comprises" and its variations are intended to cover a non-exclusive inclusion.

In the description of the present application, it should be noted that the terms "installation", "coupled", and "connected" should be understood broadly unless clearly defined and limited. For example, it may be a fixed connection, a detachable connection, or an integral connection. It may be a mechanical connection or an electrical connection. It may be directly connected or indirectly connected through an intermediate medium, which may be the internal connection between two components. The specific meanings of the above terms in the present application can be understood in the specific circumstances for those skilled in the art.

The term used herein is for the purpose of describing particular embodiments, and it is not intended to limit the exemplary embodiments. Unless the context clearly states, the singular form, "a" or "an" used herein is also intended to include the plural. It will also be understood that the terms "comprising" and/or "including", as used herein, are intended to mean the presence of the stated features, integers, steps, operations, units and/or components, and one or more other features, integers, steps, operations, units, components, and/or combinations thereof are not excluded.

The present application will be further described below in conjunction with the accompanying drawings and embodiments.

Figure 1:
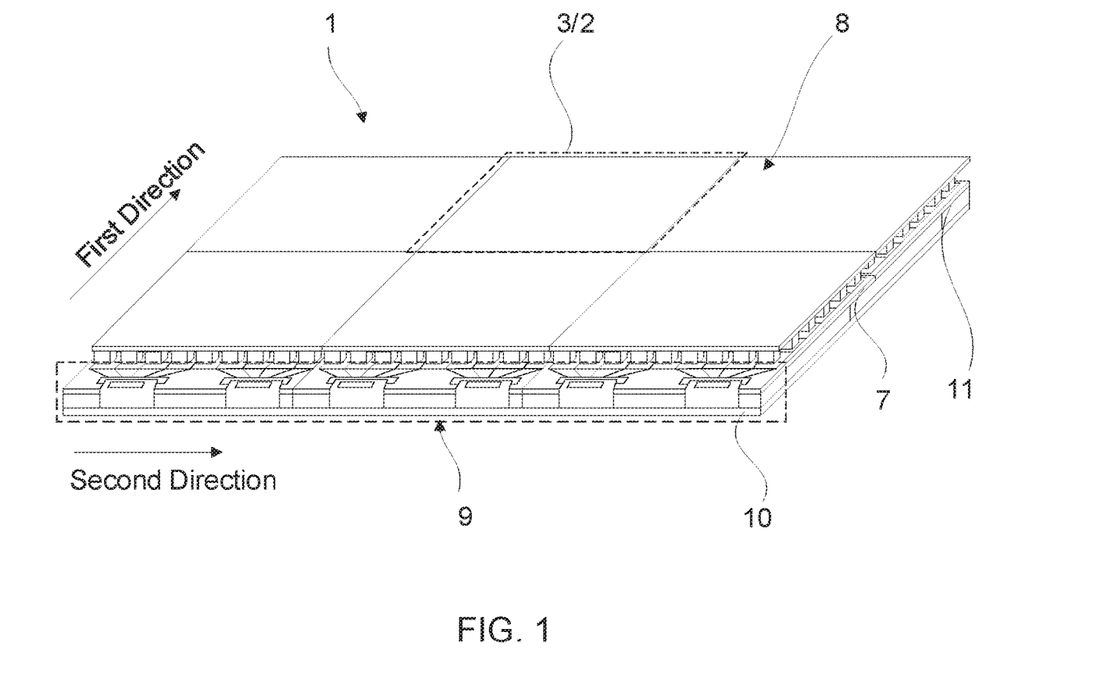
FIG. 1 is a schematic structural diagram of a seamless splicing screen according to an embodiment of the present application.
Figure 2:
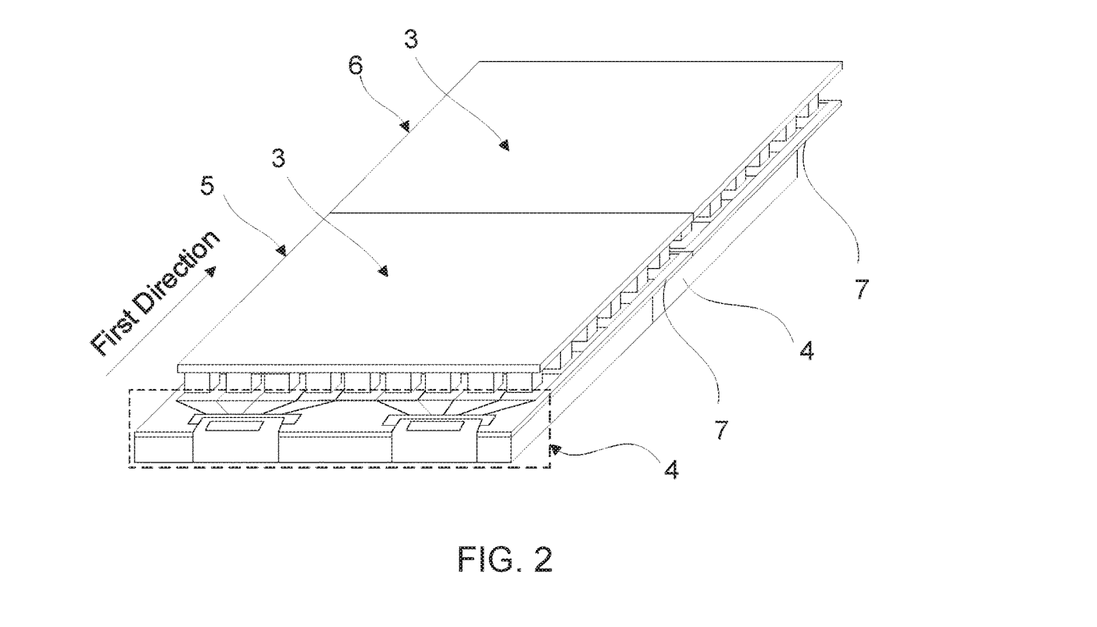
FIG. 2 is a schematic structural diagram of two adjacent unit display modules in a first direction of a splicing screen according to an embodiment of the present application.
Figure 3:
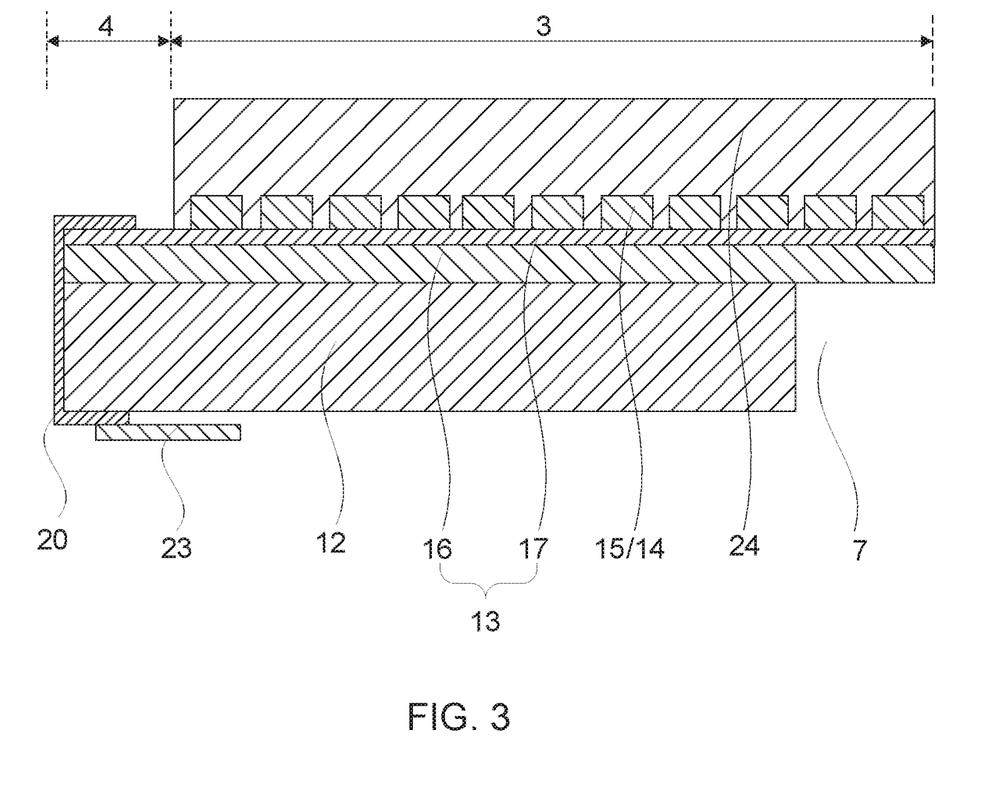
FIG. 3 is a schematic cross-sectional structural view of a unit display module according to an embodiment of the present application.

As shown in FIG. 1, an embodiment of the present application provides a seamless splicing screen 1 including a plurality of unit display modules 2 spliced with each other. As shown in FIG. 3, each of the unit display modules 2 has a unit display area 3 and a unit non-display area 4 positioned on a side of the unit display area 3. As shown in FIG. 2, In a first direction of the seamless splicing screen 1, any two adjacent unit display modules include a first unit display module 5 and a second unit display module 6, a back of the unit display area 3 of the first unit display module 5 has a hollowed out portion 7 disposed away from an end of the unit non-display area 4 of the first unit display module 5, the unit non-display area 4 of the second unit display module 6 is disposed in the hollowed out portion 7 to cause the unit display area 3 of the first unit display module 5 and the unit display area 3 of the second unit display module 6 to be adjacent to each other.

Specifically, the seamless splicing screen 1 in this embodiment can be applied to Mini-light emitting diode (LED) or Micro-LED seamless splicing technologies, that is, a light emitting layer of the unit display module 2 constituting the seamless splicing screen 1 is composed of Mini-LEDs or Micro-LEDs.

Specifically, the first direction includes a horizontal direction or a vertical direction on the seamless splicing screen 1, and the specific direction of the first direction is not limited herein.

Specifically, a thickness of the unit display area 3 of each unit display module 2 is greater than a thickness of the unit non-display area 4.

Specifically, the hollowed out portion 7 of the first unit display module 5 matches the unit non-display area 4 of the second unit display module 6, that is, the shape of the hollowed out portion 7 of the first unit display module 5 and the shape of the unit display area 3 of the second unit display module 6 are the same, and the volume of the two is equivalent (Unless the display performance of the seamless splicing screen 1 is not affected, the volume of the hollowed out portion 7 and the volume of the unit non-display area 4 matched thereto may not be exactly the same. Specifically, the thickness of the hollowed out portion 7 and the thickness of the unit non-display area 4 matched thereto may be different within a certain range.) The unit non-display area 4 of the second unit display module 6 can be disposed in the hollowed out portion 7 of the first unit display module 5, so that the unit display area 3 of the first unit display module 5 and the unit display area 3 of the second unit display module 6 are adjacent to each other.

Specifically, the first unit display module 5 and the second unit display module 6 may be the same unit display module. Of course, the first unit display module and the second unit display module may also be unit display modules having the same structure but different volumes. For example, the lengths of the first unit display module and the second unit display module in the first direction are different, but the lengths in the second direction (perpendicular to the first direction) are the same, and the thickness of the unit display area of the two is the same, and the thickness of the non-display area of the two units is also the same. Specifically, the unit display area of the first display module and the unit display area of the second unit display module may have the same length or different lengths in the first direction, but lengths of the unit display areas of the two must be the same in the second direction to ensure that the adjacent unit display areas are completely adjacent to the edge of the splicing position. In addition, the unit non-display area and the unit display area of each unit display module may have the same length in the second direction or may be different. For example, the length of the unit non-display area of the unit display module in the second direction is less than the length of the unit display area in the second direction. It should be noted that in the embodiments of the present application and the following other application embodiments, the same unit display module 2 and the unit non-display area 4 of each unit display module 2 and the unit display area 3 have the same length in the second direction are as an example, but the protection scope of the embodiments of the present application is not limited thereto.

In this embodiment, the unit non-display area 4 of each unit display module 2 constituting the splicing screen 1 is located at one side of the unit display area 3, so that the other three sides of the unit display area 3 have no border, and no border is conducive to achieve seamless stitching technology. Any adjacent two unit display modules 2 are in the first direction of the splicing screen 1, such as the first unit display module 5 and the second unit display module 6. A back of the unit display area 3 of the first unit display module 5 has a hollowed out portion 7 disposed away from an end of the unit non-display area 4 of the first unit display module 5, the unit non-display area 4 of the second unit display module 6 is disposed in the hollowed out portion 7 to cause the unit display area 3 of the first unit display module 5 and the unit display area 3 of the second unit display module 6 to be adjacent to each other, thereby achieving seamless splicing technology and obtaining the seamless splicing screen 1.

In an embodiment of the present disclosure, as illustrated in FIG. 1, in a second direction of the seamless splicing screen 1, any one of the unit display modules 2 is arranged side by side with an adjacent unit display module 2, unit display areas 3 of any two adjacent unit display modules 2 are adjacent to each other, and the second direction is perpendicular to the first direction.

Specifically, any two adjacent unit display modules 2 in the second direction of the splicing screen 1 may be arranged side by side in the same direction or may be arranged side by side in the opposite direction, but it is necessary to ensure that the unit display area 3 of the adjacent two unit display modules are arranged side by side adjacent to each other. The drawings in the embodiments of the present application only provide the unit display module 2 arranged side by side in the same direction. The following embodiments are also described by taking the unit display module 2 arranged side by side in the same direction as an example. However, the protection scope of the embodiments of the present application is not limited thereto.

In this embodiment, since only one side of each unit display module 2 is a unit non-display area 4, the unit non-display area 4 of any one of the unit display modules 2 (except for the unit display module at the partial edge position of the splicing screen) is disposed in the hollowed out portion 7 of the adjacent unit display module 2 to realize the seamless splicing of the adjacent two unit display modules in the first direction. Therefore, any one of the unit display modules 2 does not have the unit non-display area 4 in the second direction. The two unit display modules can be seamlessly spliced in the second direction by simply splicing the unit display modules 2 adjacent to each other in the second direction, and the above operation is simple.

In an embodiment, as shown in FIG. 1 and FIG. 2, the splicing screen 1 includes a display area 8 and a non-display area 9 at least one side of the display area 8. The display area 8 includes a plurality of unit display areas 3 of the unit display module 2 spliced together. The non-display area 9 includes a unit non-display area 4 of a plurality of unit display modules 2 located in the second direction and located at the edge of the splicing screen 1, the non-display area 9 is located at the edge of the splicing screen 1, and the second direction is perpendicular to the first direction.

Specifically, when any two adjacent unit display modules 2 in the second direction of the splicing screen 1 are arranged side by side in the same direction, the non-display area 9 of the splicing screen 1 is only located on one side of the display area 8. When any two adjacent unit display modules 2 in the second direction of the splicing screen 1 are arranged side by side in opposite directions, the non-display area 9 of the splicing screen 1 is located on opposite sides (not shown) of the display area 8.

In this embodiment, the display area 8 of the splicing screen 1 includes a plurality of unit display areas 3 of the unit display modules 2 spliced together. Since the unit display areas 3 of the adjacent two unit display modules 2 can be seamlessly spliced in both the first direction and the second direction, the display area 8 of the obtained splicing screen 1 is the seamless splicing display area 8, thereby realizing seamless splicing technology and obtaining the seamless splicing screen 1.

In an embodiment of the present disclosure, as shown in FIG. 1, the seamless splicing screen 1 further includes a fixing mechanism 10 positioned at a back of the unit display modules 2 spliced with each other and fixedly connected to the unit display modules 2 spliced with each other. Specifically, the hollowed out portion 7 of the plurality of unit display modules 2 on at least one edge of the splicing screen 1 is vacant, and there is not any unit non-display area 4 of the adjacent unit display module 2 disposed the hollowed out portion 7. Therefore, the splicing screen 1 is provided with a spacer 11 corresponding to the vacant hollowed out portion 7 on the fixing mechanism 10 so as to be filled in the vacant hollowed out portion 7 and serves to fix the partial unit display module 2.

In this embodiment, a plurality of unit display modules 2 spliced to each other are fixed by the fixing mechanism 10 of the back, thereby ensuring that the arbitrarily adjacent two unit display modules 2 are spliced and stable. It is avoided that the position of the adjacent two unit display modules 2 is offset to affect the stitching effect.

Figure 4:
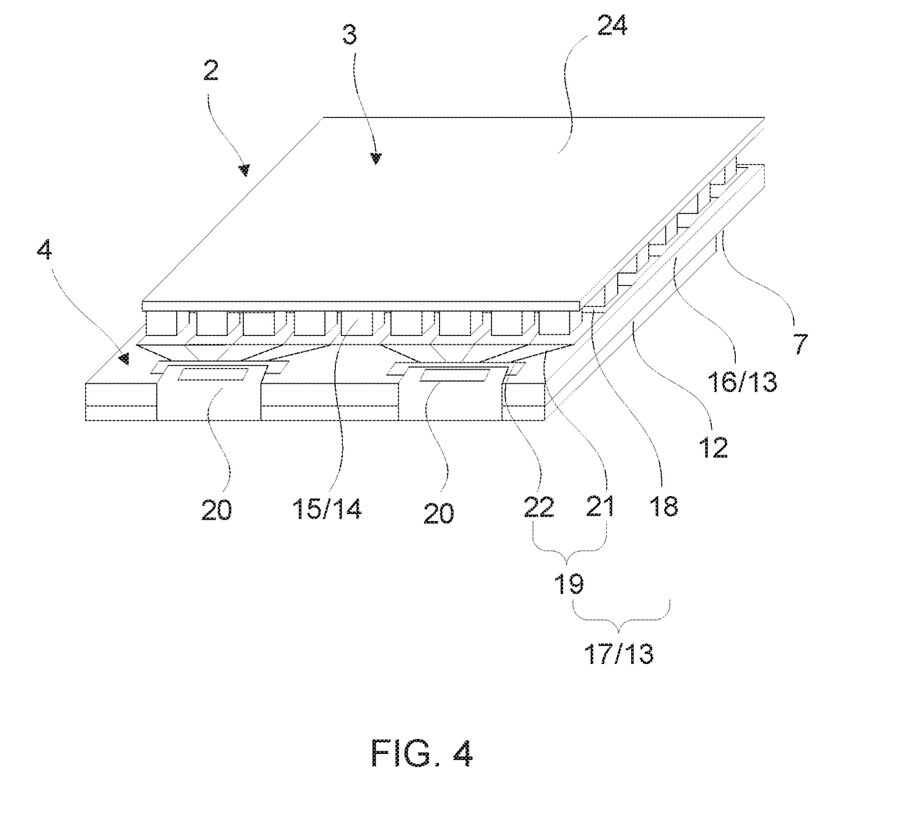
FIG. 4 is a schematic structural diagram of a unit display module according to an embodiment of the present application.

As shown in FIG. 1, an embodiment of the present application further provides a seamless splicing screen 1, which is different from the above embodiment in that, as shown in FIG. 3 and FIG. 4, each of the unit display modules 2 includes a base substrate 12, a thin film transistor (TFT) array layer 13 disposed on the base substrate 12, and a light emitting layer 14 disposed on the TFT array layer 13. The light emitting layer 14 is located in the unit display area 3. As shown in FIG. 2 and FIG. 3, the hollowed out portion 7 is disposed on the base substrate 12 of the first unit display module 5, and the unit non-display area of the base substrate 12 and the TFT array layer 13 of the second unit display module 6 (that is, the base substrate 12 and the TFT array layer 13 in the unit non-display area 4 of the second unit display module 6) is disposed in the hollowed out portion 7.

Specifically, the base substrate 12 and the TFT array layer 13 are located in the unit display area 3 and the unit non-display area 4. The base substrate 12 includes a glass substrate, and the hollowed out portion 7 on the base substrate 12 is formed by laser-cut and laser lift-off (LLO) technologies.

Specifically, the volume and shape of the hollowed out portion 7 on the base substrate 12 of the first unit display module 5 are the same as the volume and shape of the base substrate 12 of the unit non-display area 4 of the second unit display module 6. The thickness of the TFT array layer 13 of the unit non-display area 4 of the first unit display module 5 is small, and the height difference at the splicing is negligible.

Specifically, the TFT array layer 13 is formed by low temperature poly-silicon (LTPS) technology or indium gallium zinc oxide (IGZO) technology.

In this embodiment, the base substrate 12 and the TFT array layer 13 of the unit non-display area 4 of the second unit display module 6 are disposed in the hollowed out portion 7 on the base substrate 12 of the first unit display module 5, such that the unit display area 3 of the first unit display module 5 and the unit display area 3 of the second unit display module 6 are adjacent to each other, thereby implementing a seamless splicing technique and obtaining a seamless splicing screen 1. Since the unit non-display area 4 of the unit display module 2 is provided only with the base substrate 12 and the TFT array layer 13 on the base substrate 12, and the thickness of the TFT array layer 13 is small, the height difference of the splicing position when the two unit display modules 2 in the first direction are spliced can be neglected, and the display performance of the splicing position is not affected, so that the splicing and display performance of the seamless splicing screen 1 is not affected.

In an embodiment of the present disclosure, the light emitting layer 14 includes a plurality of LED chips 15 distributed in an array, and the LED chips 15 are electrically connected to the TFT array layer 13. In details, the LED chips 15 include Mini-LEDs or Micro-LEDs. The LED chips include a red LED chip, a green LED chip, and a blue LED chip. A micron-scale RGB (red, green, and blue) three-color LED chip 15 is transferred onto the TFT array layer 13 by a transfer technique to form the light emitting layer 14.

In this embodiment, since the LEDs in the LED chips 15 are self-luminous, the edges of the unit display area 3 of each unit display module 2 (except the side on which the unit non-display area 4 is provided) can be borderless, thereby when the adjacent two unit display modules 2 are spliced, the adjacent unit display areas 3 can be seamlessly spliced.

In an embodiment of the present disclosure, the TFT array layer 13 includes a flexible layer 16 disposed on the base substrate 12 and a driving circuit 17 disposed on the flexible layer 16, the LED chips 15 are electrically connected to the driving circuit 17, and the flexible layer 16 of the first unit display module 5 partially covers the unit non-display area 4 of the second unit display module 6.

In details, the driving circuit 17 includes a pixel driving circuit 18 disposed in the unit display area 3 and a peripheral driving circuit 19 disposed in the unit non-display area 4, the peripheral driving circuit 19 is electrically connected to the pixel driving circuit 18, and the light emitting layer 14 is disposed on the pixel driving circuit 18 and electrically connected to the pixel driving circuit 18. One end of the peripheral driving circuit 19 is electrically connected to the pixel driving circuit 18, and the other end thereof is electrically connected to a flexible circuit board 20 (that is chip on film, COF) of the corresponding unit display module 2. When the first unit display module 5 and the second unit display module 6 are spliced, part of the flexible circuit board 20 of the second unit display module 6 is also located in the hollowed out portion 7 of the first unit display module 5. Since the thickness of the flexible circuit board 20 is small, the influence on the splicing is negligible.

Specifically, the peripheral driving circuit 19 includes a fanout circuit 21 extending from the pixel driving circuit 18, and a bonding pad 22 disposed at one end of the fanout circuit 21 away from the unit display area 3. The bonding pad 22 is connected to one end of the flexible circuit board 20, and the other end of the flexible circuit board 20 is electrically connected to the printed circuit board (PCB) 23 of the unit display module 2. The printed circuit board 23 is used to input a display signal to the unit display area 3 of the unit display module 2. The flexible circuit board 20 of each unit display module 2 is attached to the side and back of the unit non-display area 4 of the unit display module 2. The printed circuit board 23 of each unit display module 2 is disposed on the back of the unit display module 2.

Specifically, positive and negative electrodes of the LED chip 15 on each unit display module 2 are respectively connected to the pixel driving circuit 18. The pixel driving circuit 18 can control ON/OFF (on or off) and brightness of each LED chip 15 (pixel) independently and by address by controlling the current to reach display.

In details, material of the flexible layer 16 includes polyimide, and a thickness of the flexible layer 16 ranges from 1 to 100 microns. The hollowed out portion 7 of the first unit display module 5 is formed by peeling off the base substrate 12 partially located in the unit display region 3 from the flexible layer 16 by laser cutting and laser lift-off (LLO) technology, thereby making a portion of the flexible layer 16 exposed by the hollowed out portion 7. Therefore, when the non-unit display area 3 of the second unit display module 6 is disposed in the hollowed out portion 7 of the first unit display module 5, the flexible layer 16 exposed by the hollowed out portion 7 is overlaid on the non-unit display area 3 of the second unit display module 6.

In this embodiment, when the first unit display module 5 and the second unit display module 6 are spliced, the bare flexible layer 16 of the first unit display module 5 is aligned to the second unit display module 6 on the TFT array layer 13 of the non-display area 4, the base substrate 12, the TFT array layer 13 and the partial flexible circuit board 20 of the unit non-display area 4 of the second unit display module 6 are located in the hollowed out portion 7 of the first unit display module 5. Since the TFT array layer 13 and the flexible circuit board 20 are thin, the height (height difference) of the splicing position of the first unit display module 5 and the second unit display module 6 is negligible. Therefore, an embodiment of the present application can realize a seamless splicing technique and obtain a seamless splicing screen 1.

In an embodiment of the present disclosure, each of the unit display modules 2 further includes an encapsulation layer 24 disposed in the unit display area 3, and the encapsulation layer 24 is overlaid on the light emitting layer 14. In details, the encapsulation layer 24 includes an encapsulation glue, and the encapsulation glue covers the LED chip 15 of the unit display area 3 to encapsulate the LED chip 15. Material of the encapsulation layer includes an epoxy, acrylic, or a silicone based resin material.

In this embodiment, the encapsulation layer 24 can prevent the LED chip 15 from falling off and prevent the LED chip 15 from being damaged by water and oxygen; the coating position of the encapsulation layer 24 of each unit display module 2 is strictly controlled in the unit display area 3. The unit display area 3 can be borderless at the edge, which is advantageous for implementing seamless splicing technology.

In the above, although the present application has been disclosed in the above preferred embodiments, the preferred embodiments are not intended to limit the application, and those skilled in the art can make various modifications without departing from the spirit and scope of the application. The invention is modified and retouched, and the protection scope of the present application is determined by the scope defined by the claims.

What is claimed is:

1. A seamless splicing screen, comprising:
   a plurality of unit display modules spliced with each other, each of the unit display modules having a unit display area and a unit non-display area positioned on a side of the unit display area; and
   a fixing mechanism positioned at a back of the unit display modules spliced with each other and fixedly connected to the unit display modules spliced with each other;
   wherein in a first direction of the seamless splicing screen, any two adjacent unit display modules comprise a first unit display module and a second unit display module, a back of the unit display area of the first unit display module has a hollowed out portion disposed away from an end of the unit non-display area of the first unit display module, the unit non-display area of the second unit display module is disposed in the hollowed out portion to cause the unit display area of the first unit display module and the unit display area of the second unit display module to be adjacent to each other;
   wherein the unit non-display area of each of the unit display modules constituting the seamless splicing screen is located at one side of the unit display area, so that other three sides of the unit display area have no border, the hollowed out portion of each of the unit display modules on at least one edge of the seamless splicing screen is vacant, the seamless splicing screen is provided with a spacer corresponding to a vacant hollowed out portion on the fixing mechanism, such that the spacer is filled in the vacant hollowed out portion and serves to fix a partial unit display module.

2. The seamless splicing screen according to claim 1, wherein each of the unit display modules comprises a base substrate, the hollowed out portion is disposed on a base substrate of the first unit display module, and the unit non-display area of the base substrate of the second unit display module is disposed in the hollowed out portion.

3. The seamless splicing screen according to claim 2, wherein each of the unit display modules further comprises a thin film transistor (TFT) array layer disposed on the base substrate and a light emitting layer disposed on the TFT array layer, and the light emitting layer is disposed in the unit display area.

4. The seamless splicing screen according to claim 3, wherein the light emitting layer comprises a plurality of LED chips distributed in an array, and the LED chips are electrically connected to the TFT array layer.

5. The seamless splicing screen according to claim 4, wherein the TFT array layer comprises a flexible layer disposed on the base substrate and a driving circuit disposed on the flexible layer, the LED chips are electrically connected to the driving circuit, and the flexible layer of the first unit display module partially covers the unit non-display area of the second unit display module.

6. The seamless splicing screen according to claim 5, wherein the driving circuit comprises a pixel driving circuit disposed in the unit display area and a peripheral driving circuit disposed in the unit non-display area, the peripheral driving circuit is electrically connected to the pixel driving circuit, and the light emitting layer is disposed on the pixel driving circuit and electrically connected to the pixel driving circuit.

7. The seamless splicing screen according to claim 6, wherein each of the unit display modules further comprises a flexible circuit board and a printed circuit board, an end of the peripheral driving circuit away from the unit display area is electrically connected to an end of the flexible circuit board, another end of the flexible circuit board is electrically connected to the printed circuit board, the flexible circuit board is disposed at a side and a back of the unit non-display area of the unit display module, and the printed circuit board is disposed at the back of the unit display module.

8. The seamless splicing screen according to claim 5, wherein material of the flexible layer comprises polyimide, and a thickness of the flexible layer ranges from 1 to 100 microns.

9. The seamless splicing screen according to claim 4, wherein the LED chips comprise Mini-LEDs or Micro-LEDs.

10. The seamless splicing screen according to claim 4, wherein the LED chips comprise a red LED chip, a green LED chip, and a blue LED chip.

11. The seamless splicing screen according to claim 3, wherein each of the unit display modules further comprises an encapsulation layer disposed in the unit display area, and the encapsulation layer is overlaid on the light emitting layer.

12. The seamless splicing screen according to claim 11, wherein material of the encapsulation layer comprises an epoxy, acrylic, or a silicone based resin material.

13. The seamless splicing screen according to claim 1, wherein the hollowed out portion of the first unit display module matches the unit non-display area of the second unit display module.

14. The seamless splicing screen according to claim 1, wherein in a second direction of the seamless splicing screen, any one of the unit display modules is arranged side by side with an adjacent unit display module, unit display areas of any two adjacent unit display modules are adjacent to each other, and the second direction is perpendicular to the first direction.

15. The seamless splicing screen according to claim 1, further comprising a display area and a non-display area positioned on at least one side of the display area, wherein the display area comprises the unit display areas of the unit display modules spliced with each other, the non-display area comprises the unit non-display areas of the unit display modules in the second direction and positioned at an edge of the seamless splicing screen, the non-display area is positioned at an edge of the seamless splicing screen, and the second direction is perpendicular to the first direction.

16. A seamless splicing screen, comprising:
a plurality of unit display modules spliced with each other, each of the unit display modules having a unit display area and a unit non-display area positioned on a side of the unit display area, and the unit display area of each of the unit display modules comprising a plurality of LED chips for emitting light and arranged in an array; and
a fixing mechanism positioned at a back of the unit display modules spliced with each other and fixedly connected to the unit display modules spliced with each other;
wherein in a first direction of the seamless splicing screen, any two adjacent unit display modules comprise a first unit display module and a second unit display module, a back of the unit display area of the first unit display module has a hollowed out portion disposed away from an end of the unit non-display area of the first unit display module, the unit non-display area of the second unit display module is disposed in the hollowed out portion to cause the unit display area of the first unit display module and the unit display area of the second unit display module to be adjacent to each other; and
wherein in a second direction of the seamless splicing screen, any one of the unit display modules is arranged side by side with an adjacent unit display module, unit display areas of any two adjacent unit display modules are adjacent to each other, and the second direction is perpendicular to the first direction;
wherein the unit non-display area of each of the unit display modules constituting the seamless splicing screen is located at one side of the unit display area, so that other three sides of the unit display area have no border, the hollowed out portion of each of the unit display modules on at least one edge of the seamless splicing screen is vacant, the seamless splicing screen is provided with a spacer corresponding to a vacant hollowed out portion on the fixing mechanism, such that the spacer is filled in the vacant hollowed out portion and serves to fix a partial unit display module.

* * * * *